US011251266B2

United States Patent
Brandt et al.

(10) Patent No.: US 11,251,266 B2
(45) Date of Patent: Feb. 15, 2022

(54) POWER SEMICONDUCTOR DEVICE AND METHOD OF PROCESSING A POWER SEMICONDUCTOR DEVICE

(71) Applicant: Infineon Technologies AG, Neubiberg (DE)

(72) Inventors: Philip Christoph Brandt, Oberhaching (DE); Manfred Pfaffenlehner, Munich (DE); Frank Dieter Pfirsch, Munich (DE); Francisco Javier Santos Rodriguez, Villach (AT); Steffen Schmidt, Dresden (DE); Frank Umbach, Munich (DE)

(73) Assignee: Infineon Technologies AG, Neubiberg (DE)

( * ) Notice: Subject to any disclaimer, the term of this patent is extended or adjusted under 35 U.S.C. 154(b) by 175 days.

(21) Appl. No.: 16/791,319

(22) Filed: Feb. 14, 2020

(65) Prior Publication Data
US 2020/0266269 A1 Aug. 20, 2020

(30) Foreign Application Priority Data
Feb. 15, 2019 (DE) .......................... 102019103899.5

(51) Int. Cl.
*H01L 29/06* (2006.01)
*H01L 29/40* (2006.01)
*H01L 21/765* (2006.01)
*H01L 21/761* (2006.01)

(52) U.S. Cl.
CPC ........ *H01L 29/0623* (2013.01); *H01L 21/761* (2013.01); *H01L 21/765* (2013.01); *H01L 29/404* (2013.01); *H01L 29/407* (2013.01)

(58) Field of Classification Search
CPC . H01L 29/0623; H01L 29/404; H01L 21/765; H01L 21/761; H01L 29/407; H01L 21/763; H01L 29/7811; H01L 29/861; H01L 29/7397; H01L 29/7393;
(Continued)

(56) References Cited

U.S. PATENT DOCUMENTS 7,655,975 B2 * 2/2010 Hirler ................. H01L 29/7813
257/331
9,190,480 B2 11/2015 Siemieniec et al.
2013/0020671 A1 1/2013 Lee et al.
(Continued)

*Primary Examiner* — Selim U Ahmed
(74) *Attorney, Agent, or Firm* — Murphy, Bilak & Homiller, PLLC

(57) ABSTRACT

A power semiconductor device includes a semiconductor body having a drift region of a first conductivity type inside an active region. An edge termination region includes: a guard region of a second conductivity type at a front side of the semiconductor body and surrounding the active region; and a field plate trench structure extending vertically into the body from the front side and at least partially filled with a conductive material that is electrically connected with the guard region and insulated from the body external of the guard region. A first portion of the field plate trench structure at least partially extends into the guard region and is at least partially arranged below a metal layer arranged at the front side. A second portion of the field plate trench structure extends outside of the guard region and surrounds the active area, the metal layer not extending above the second portion.

20 Claims, 10 Drawing Sheets

(58) Field of Classification Search
CPC ............. H01L 29/4238; H01L 29/0619; H01L 29/0696; H01L 29/0615; H01L 29/66325
See application file for complete search history.

(56) References Cited

U.S. PATENT DOCUMENTS

| | | |
|---|---|---|
| 2015/0333132 A1 | 11/2015 | Yeh et al. |
| 2016/0293691 A1* | 10/2016 | Falck .................... H01L 29/407 |
| 2016/0300904 A1 | 10/2016 | Antoniou et al. |
| 2018/0114830 A1* | 4/2018 | Griebl ................... H01L 29/405 |
| 2019/0140084 A1* | 5/2019 | Shirakawa ............ H01L 29/417 |

* cited by examiner

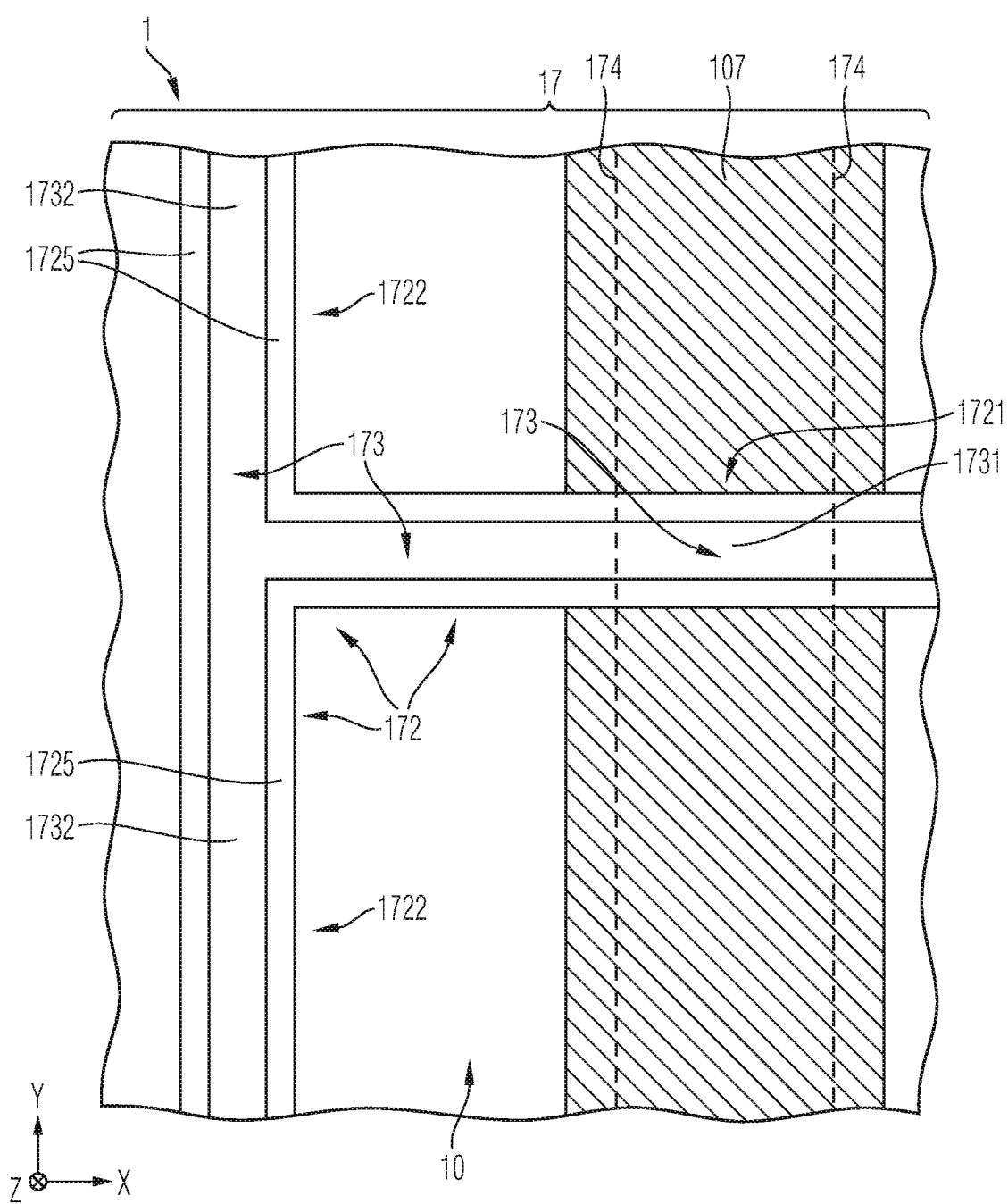

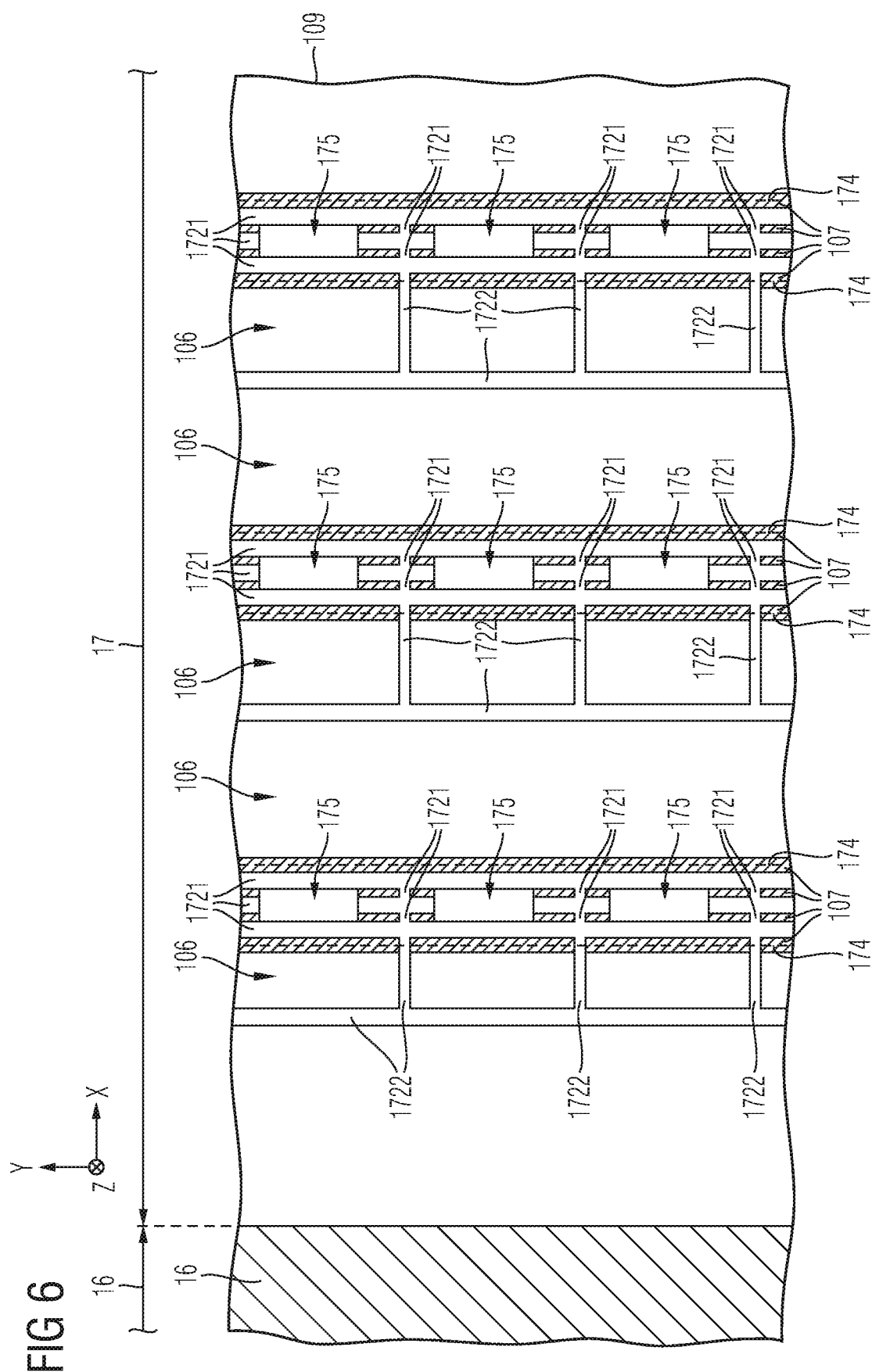

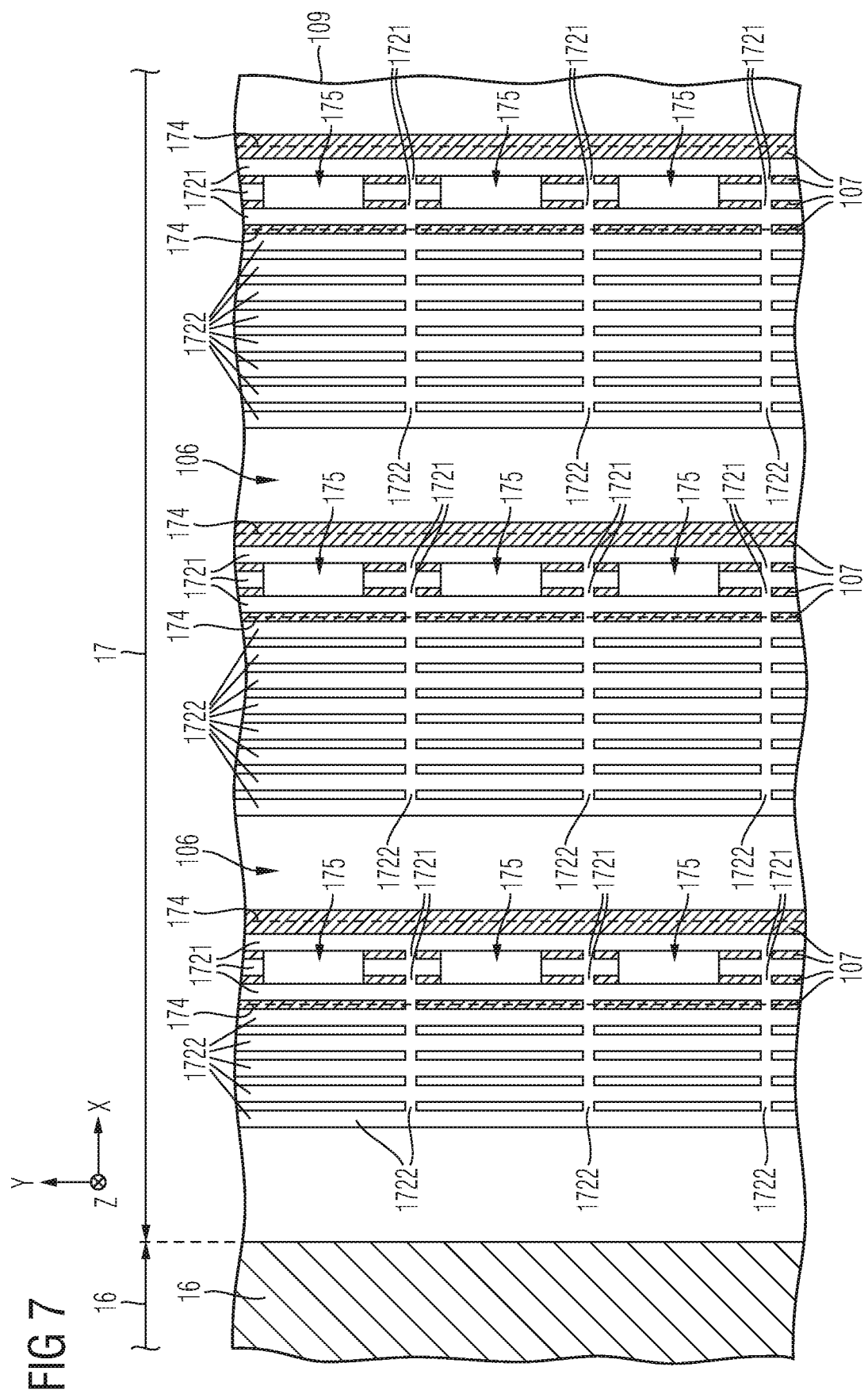

POWER SEMICONDUCTOR DEVICE AND METHOD OF PROCESSING A POWER SEMICONDUCTOR DEVICE

TECHNICAL FIELD

This specification refers to embodiments of a power semiconductor device and to embodiments of a method of producing such a power semiconductor device. In particular, this specification refers to embodiments of a power semiconductor device having an edge termination structure that includes a guard region and a field plate structure, as well as to embodiments of a method of producing such a power semiconductor device.

BACKGROUND

Many functions of modern devices in automotive, consumer and industrial applications, such as converting electrical energy and driving an electric motor or an electric machine, rely on power semiconductor devices. For example, insulated gate bipolar transistors (IGBTs), metal oxide semiconductor field effect transistors (MOSFETs) and diodes, to name a few, have been used for various applications including, but not limited to switches in power supplies and power converters, e. g., in traction applications.

A power semiconductor device usually comprises a semiconductor body that is configured for conducting a load current along a load current path between two load terminals of the device. Further, in case the power semiconductor device has a transistor configuration, the load current path may be controlled by means of an insulated electrode, often referred to as gate electrode. For example, upon receiving a corresponding control signal from, e. g., a driver unit, the control electrode may set the power semiconductor device in one of a conducting state and a blocking state.

Further, for conducting the load current, the power semiconductor device may comprise one or more power cells, which may be arranged in a so-called active region of the power semiconductor device. The power semiconductor device may be laterally confined by an edge. Between the lateral edge and the active region that comprises the one or more power cells, there may be arranged an edge termination region, which may comprise an edge termination structure. Such an edge termination structure may serve for the purpose of influencing the course of an electric field within the semiconductor body, e. g., so as to ensure a reliable blocking capability of the power semiconductor device. The edge termination structure may comprise one or more components arranged within the semiconductor body, and also one or more components arranged above a surface of the semiconductor body.

A common example of such edge termination concepts is a combination of p-doped field rings (also referred to as guard rings or guard regions) with field plates, wherein the field plates may be configured for providing an effective screening of external charges. For example, the field plates may comprise a metal, such as aluminum. Alternatively, such field plates may be formed of poly-silicon. For example, in an edge termination structure combining p-doped field rings with n-doped poly-silicon field plates, metallic layers may still be present to provide an electric contact between a field plate and a field ring reducing the influence of an electric field on the outer edges of the metallic layers.

It is desirable to provide further edge termination concepts that are reliable, such as robust against destruction by corrosion, and may be easily integrated into existing processing flows of a power semiconductor device.

SUMMARY

According to an embodiment, a power semiconductor device comprises a semiconductor body and exhibits an active region and an edge termination region, wherein, inside the active region, the semiconductor body comprises a drift region of a first conductivity type, and wherein the edge termination region comprises: a guard region of a second conductivity type, the guard region being included in the semiconductor body at a front side of the semiconductor body and surrounding the active region; and a field plate trench structure extending vertically into the semiconductor body from the front side and being at least partially filled with a conductive material, the conductive material being electrically connected with the guard region and insulated from the semiconductor body external of the guard region by a field plate insulation structure. A first portion of the field plate trench structure extends, at least partially, into the guard region and is arranged, at least partially, below a metal layer that is arranged at the front side. A second portion of the field plate trench structure extends outside of the guard region and completely surrounds the active area, wherein the metal layer does not extend above the second portion of the field plate trench structure.

According to another embodiment, a method of forming a power semiconductor device is presented. The method comprises: providing a semiconductor body; forming an active region and an edge termination region, wherein, inside the active region, the semiconductor body comprises a drift region of a first conductivity type, and wherein forming the edge termination region comprises: forming a guard region of a second conductivity type, the guard region being included in the semiconductor body at a front side of the semiconductor body and surrounding the active region; forming a field plate trench structure extending vertically into the semiconductor body from the front side and being at least partially filled with a conductive material, the conductive material being electrically connected with the guard region and insulated from the semiconductor body external of the guard region by a field plate insulation structure, wherein a first portion of the field plate trench structure extends, at least partially, into the guard region and is arranged, at least partially, below a metal layer that is arranged at the front side; and a second portion of the field plate trench structure extends outside of the guard region and completely surrounds the active area, wherein the metal layer does not extend above the second portion of the field plate trench structure.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings:

FIG. 2 schematically and exemplarily illustrates a section of a horizontal cross-section of a power semiconductor device in accordance with one or more embodiments;

FIG. 6 schematically and exemplarily illustrates a section of a horizontal cross-section of a power semiconductor device in accordance with one or more embodiments;

FIG. 7 schematically and exemplarily illustrates a section of a horizontal cross-section of a power semiconductor device in accordance with one or more embodiments.

DETAILED DESCRIPTION

Figure 1A:
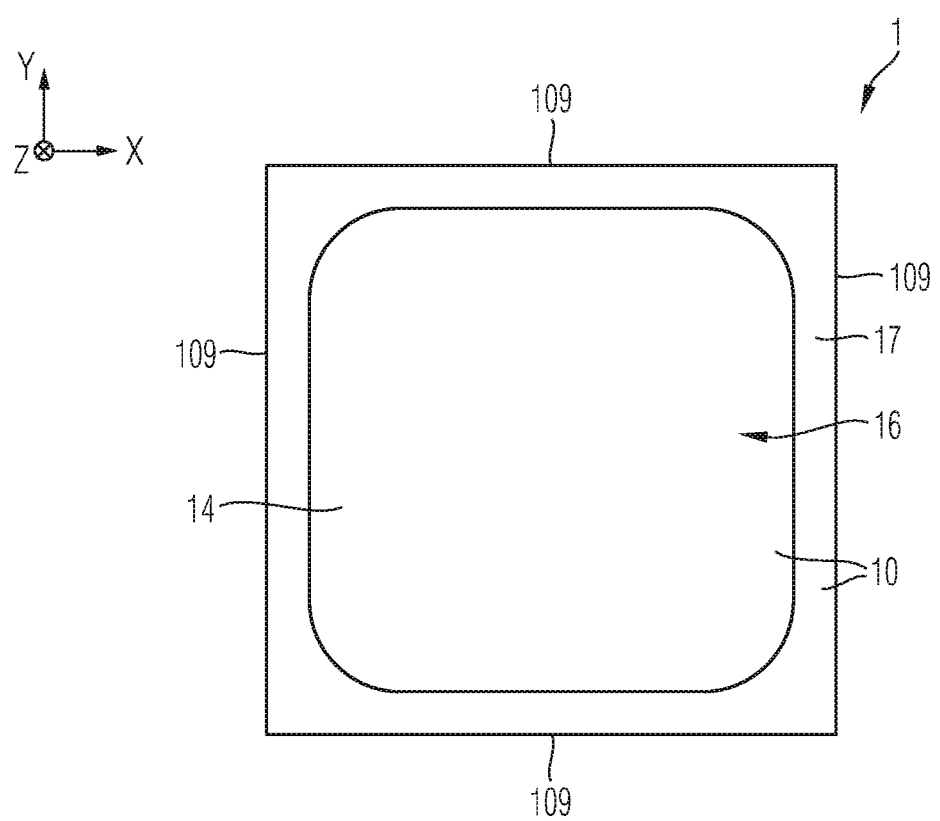
FIGS. 1A-1C each schematically and exemplarily illustrate a top view of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell or cellular cell configuration, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor cells, such as a monolithically integrated diode cell, e.g., monolithically integrated cell of two anti-serially connected diodes, a monolithically integrated transistor cell, e.g., a monolithically integrated IGBT cell and/or derivatives thereof. Such diode/transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 500 V or even more, e.g., up even to at least 6 kV or more.

For example, the power semiconductor device described below may be a semiconductor device exhibiting a stripe cell configuration or a cellular (columnar/needle) cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

Figure 1B:
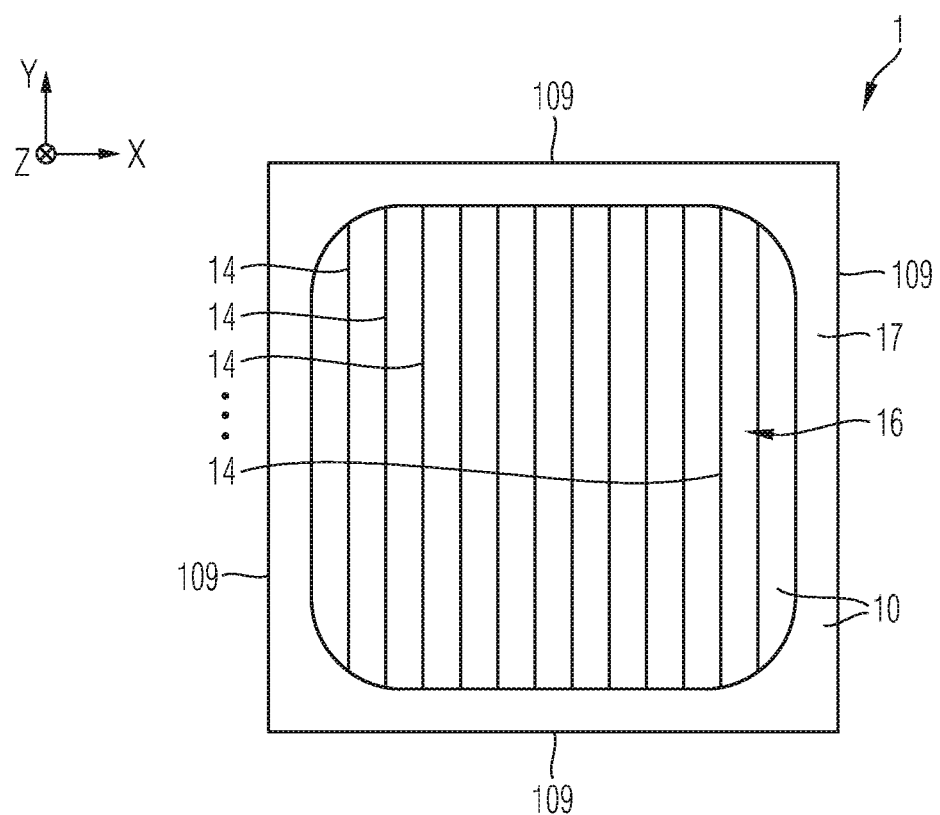
Figure 1C:
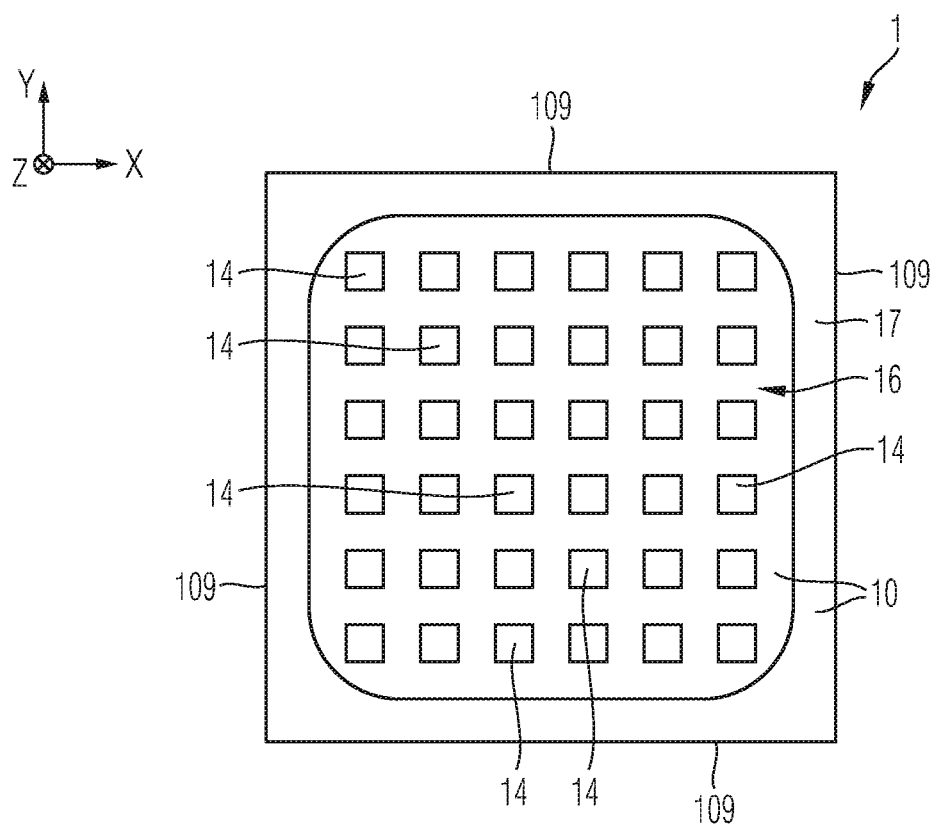

FIGS. 1A to 1C each schematically and exemplarily illustrate a top view of a power semiconductor device 1 in accordance with some embodiments. The illustrated vertical projection is in each case in parallel to a plane defined by a first lateral direction X and a second lateral direction Y and orthogonal to a vertical direction Z. The power semiconductor device 1 comprises a semiconductor body 10 having lateral chip edges 109. For example, the chip edges 109 may have come into being, e. g., by means of wafer dicing.

Further, the power semiconductor device 1 exhibits an active region 16 that is configured for conducting a load current (e. g. substantially along the vertical direction Z) and an edge termination region 17 that is arranged laterally in between the chip edge 109 and the active region 16. For example, the active region may comprise a drift region of the first conductivity type (e.g. n-type), which is configured for conducting the load current, as is well known in the art. As schematically illustrated in each of FIGS. 1A to 1C, the active region 16 may be laterally surrounded by the edge termination region 17.

For example, the active region 16 comprises one or more power cells 14 that each extend at least partially into the semiconductor body 10. The present specification is not limited to a specific kind of configuration of the one or more power cells 14. Rather, the power cells 14 can exhibit any configuration that is common for a power semiconductor device, e. g., at least one of a diode configuration, a thyristor configuration, a MOS gated diode (MGD) configuration, a transistor configuration, such as an IGBT configuration, an RC (reverse conducting) IGBT configuration, a MOSFET configuration, and any configuration derived there from. The skilled person is acquainted with these kinds of configurations. Accordingly, in FIGS. 1A-C, the power cells 14 are only schematically illustrated, as the exact configuration is not a major subject of this specification.

For example, the configuration shown in FIG. 1A may correspond to a power diode configuration comprising a single power cell 14. By contrast, the configurations illustrated in FIGS. 1B and 1C may, for instance, represent semiconductor switch configurations (such, e. g., a MOSFET and/or IGBT configuration), wherein the power cells 14 may be configured for controlling a load current by switching the power semiconductor device 1 into one of a conducting state and a blocking state. Such power cells 14 may, for example, comprise a control structure such as a MOS-control structure. As exemplarily illustrated in FIG. 1B, the power cells 14 may exhibit a stripe configuration, which may extend, e. g., throughout the entire active region 16 along the second lateral direction Y. In another embodiment, as illustrated in FIG. 1C, the power cells 14 may exhibit a cellular configuration, e. g., having a horizontal cross-section exhibiting one of a quadratic shape, a rectangular shape, a rectangular shape with rounded corners, a circular shape, and an ellipsoidal shape.

The one or more power cells 14 that may be included in the active region 16 of the power semiconductor device 1 may be configured for selectively conducting a load current and for blocking a blocking voltage depending, e. g., on a switching state of the power semiconductor device 1 and/or on a direction in which a current and/or voltage is fed or applied to the power semiconductor device 1.

For example, the power semiconductor device 1, by means of the at least one power cell 14, may be configured for supporting a blocking voltage of at least 300 V, of at least 500 V, of at least 600 V, of at least 1000 V, of at least 1500 V, or of at least 3000 V, or of even more than 6000 V. Further, the at least one power cell 14 may exhibit a compensation structure which is also referred to as a "superjunction" structure.

For example, in order to control the one or more power cells 14, a control terminal (not illustrated) may be provided that may be configured for forwarding a control signal to a control electrode structure of the one or more power cells 14. For example, the control terminal can be a gate terminal. Thereby, the power semiconductor device 1 may be set into one of the conducting state and the blocking state. In an embodiment, such a control signal can be provided by means of applying a voltage between the control terminal and a first load terminal (not shown in FIGS. 1A-C).

Turning now to the edge termination region 17, as is in principle well known in the art, said edge termination region 17 may comprise an edge termination structure that is not configured for conducting a load current, but rather configured for ensuring a reliable blocking capability of the power semiconductor device 1 (not illustrated in FIGS. 1A-C). Such an edge termination structure may be configured for laterally terminating an electric field that is present in the semiconductor body 10 in a blocking state of the power semiconductor device 1. For example, to this end, the edge termination structure may comprise at least one of a junction-termination-extension (JTE) structure, a field ring/field plate termination structure, a variation-of-lateral-doping (VLD) structure, and a combined VLD-DLC edge termination structure. The skilled person is acquainted with these kinds of edge termination structures as such.

In the following, a combination of a field plate trench structure 172 and at least one guard region 107, each of which are arranged inside the edge termination region 17, will be described with reference to FIGS. 2-8. For example, said combination of a field plate trench structure 172 and one or more guard regions (such as guard rings) 107 may constitute an edge termination structure or form at least a part of an edge termination structure. In other words, the combination of a field plate trench structure 172 and one or more guard regions 107 proposed with the present invention may be used as a special kind of a field ring/field plate termination structure. For example, in an embodiment, a field ring/field plate termination structure may be entirely formed by such a combination of a field plate trench structure 172 and one or more guard regions 107.

FIG. 2 schematically and exemplarily illustrates a section of a horizontal cross-section of a power semiconductor device 1 in accordance with one or more embodiments of the present invention. More precisely, a section of a horizontal cross-section (parallel to the XY plane) of the edge termination region 17 is shown in FIG. 2, wherein the horizontal cross-section extends close to a front side 10-1 (cf. FIGS. 5A-B) of the semiconductor body 10. For example, the section of the edge termination region 17 may be located in the vicinity of the left chip edge 109 or in the vicinity of the right chip edge 109 of one of the power semiconductor devices 1 depicted in FIGS. 1A-C.

The illustrated section of the edge termination region 17 comprises a semiconductor guard region 107 of the second conductivity type (e.g., p-type). Throughout the Figures, the one or more guard regions 107 that is/are present in the different embodiments are displayed as hatched areas. The guard region 107 is included in the semiconductor body 10 at a front side 10-1 of the semiconductor body 10. Further, the guard region 107 entirely surrounds the active region 16, which cannot be seen in FIG. 2, since it only depicts a section of the edge termination region 17. However, the person skilled in the will understand that the second portion 1722 of the field plate trench structure 172 may entirely surround the active area 16, e.g., in the manner of a p-ring of a conventional field ring/field plate termination structure. Correspondingly, the guard region 107 may also be referred to as a guard ring or a field ring. In case the second conductivity type is p-type, the guard region 107 may also be referred to as a p-ring. For example, the guard region 107 as such may be similar or identical to field rings that are conventionally used as a part of a field ring/field plate termination structure.

The portion of the guard region 107 that is depicted in FIG. 2 has an elongate shape extending in an essentially rectilinear manner along a main lateral extension direction Y. In other words, in a top view as shown in FIG. 2, said portion of the guard region 107 essentially exhibits the shape of an elongated rectangle. In the present exemplary embodiment, the main lateral extension direction coincides with the second lateral direction Y. Other portions of the guard region 107, which lie outside the section depicted in FIG. 2, may exhibit a different main lateral extension direction. For example, portions of the guard region 107 that are located in the vicinity of upper and lower chip edges 109 (cf. FIG. 1A-C), respectively, may have a main lateral extension direction that coincides with the first lateral direction X. Further, the guard region 107, which surrounds the active region 16, may exhibit nonlinear portions, such as angled or rounded portions, e.g., in the vicinity of chip corners.

In addition, the edge termination region 17 comprises a field plate trench structure 172 that extends vertically (i.e., along the vertical direction Z) into the semiconductor body 10 from the front side 10-1. The vertical extension of the field plate trench structure 17 is not visible in the top view of FIG. 2. In this regard, it is referred to the vertical cross-sections of FIGS. 5A-B, which will be described below.

The field plate trench structure 172 comprises several trench portions, which are filled with a conductive material 173, wherein the conductive material 173 may, for example, consist in or comprise polysilicon. The conductive material 173 is insulated from the semiconductor body 10 external of the guard region 107 (such as from an n-doped semiconductor region of the semiconductor body 10) by a field plate insulation structure 1725, such as, e.g., an oxide that forms respective trench sidewalls and trench bottoms of the trench portions.

Figure 5A:
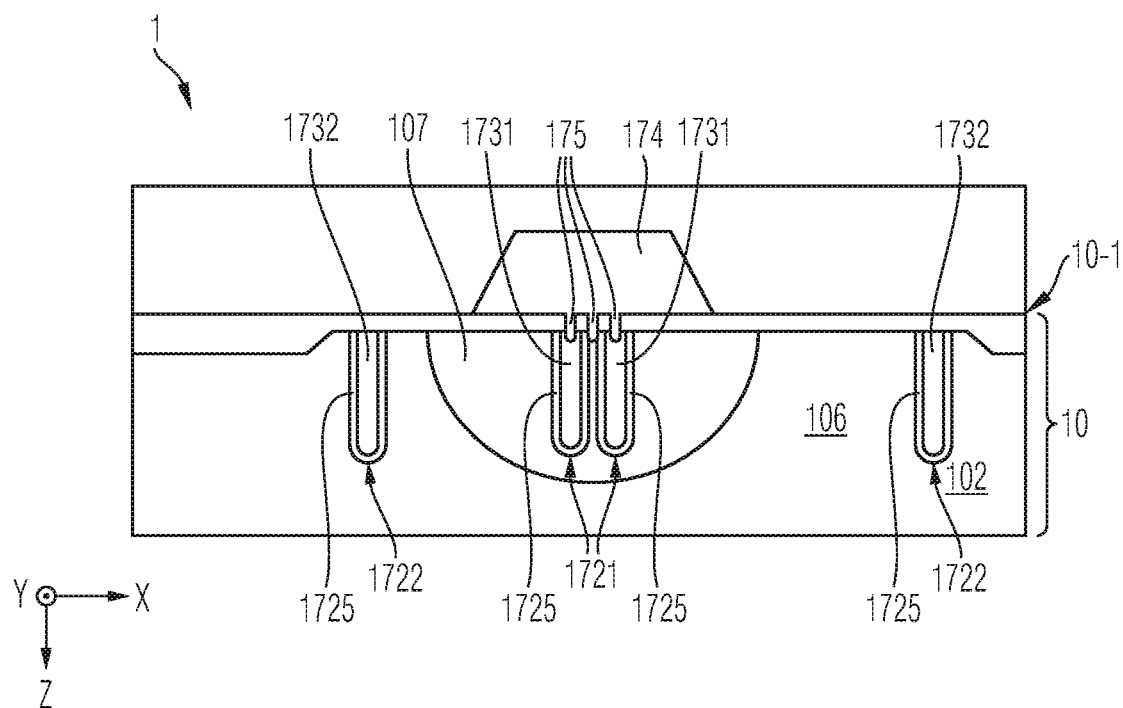
FIG. 5A schematically and exemplarily illustrates a section of a vertical cross-section of a power semiconductor device in accordance with one or more embodiments.
Figure 5B:
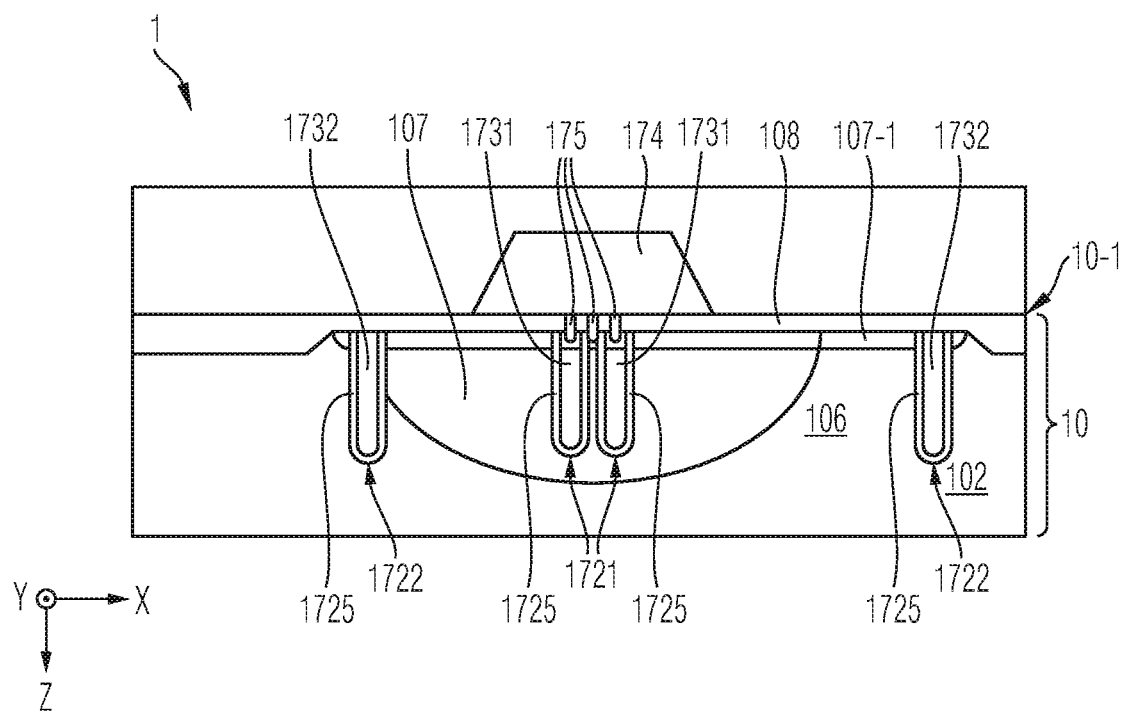
FIG. 5B schematically and exemplarily illustrates a section of a vertical cross-section of a power semiconductor device in accordance with one or more embodiments.

A first portion 1721 of the field plate trench structure 172 extends—both vertically and laterally—into the guard region 107 (see also FIG. 5A-C for the vertical dimension). The first portion 1721 is arranged, at least partially, below a metal layer 174 that is arranged at the front side 10-1. It should be noted that throughout the Figures, the extension of the metal layer(s) 174 is represented by dashed lines, even if, e. g., said first portion 1721 of the field plate trench structure 172 (depicted with solid lines) extends below the metal layer 174.

A second portion 1722 of the field plate trench structure 172 extends (laterally) outside of the guard region 107 and completely surrounds the active area 16. That the second portion surrounds the active area 16 is not illustrated in FIG. 2, which merely depicts a section of the edge termination 17. However, the person skilled in the art understands that the second portion 1722 of the field plate trench structure 172 may entirely surround the active area 16, e. g., in the manner of a p-ring of a conventional field ring/field plate termination structure. The metal layer 174 does not extend above the second portion 1722 of the field plate trench structure 172.

The first portion 1721 of the field plate trench structure 172 comprises a first portion 1731 of the conductive material 173 that is electrically connected with the guard region 107. For example, the first portion of the conductive material 173 may be electrically connected with the guard region 107 by means of the metal layer 174. Details of the electrical contacting of the guard ring 107 and the conductive material 107 will be explained further below with respect to exemplary embodiments.

The second portion 1722 of the field plate trench structure 172 comprises a second portion 1732 of the conductive material 173, wherein the second portion 1732 of the conductive material 173 is electrically connected with the guard region 107 by means of the first portion 1731 of the conductive material 173. For example, the second portion of the conductive material 173 may be electrically connected with the guard region 107 only via the first portion of the conductive material 173.

The second portion 1722 of the field plate trench structure 172 that is shown in FIG. 2 extends in parallel to the main lateral extension direction Y of the guard region 107. By contrast, the first portion 1721 of the field plate trench structure 172 that is shown in FIG. 2 extends in transversely, namely essentially orthogonal to the main lateral extension direction Y of the guard region 107. Hence, the first portion 1721 extends transversely, namely essentially orthogonal, to the second portion 1722.

Figure 3:
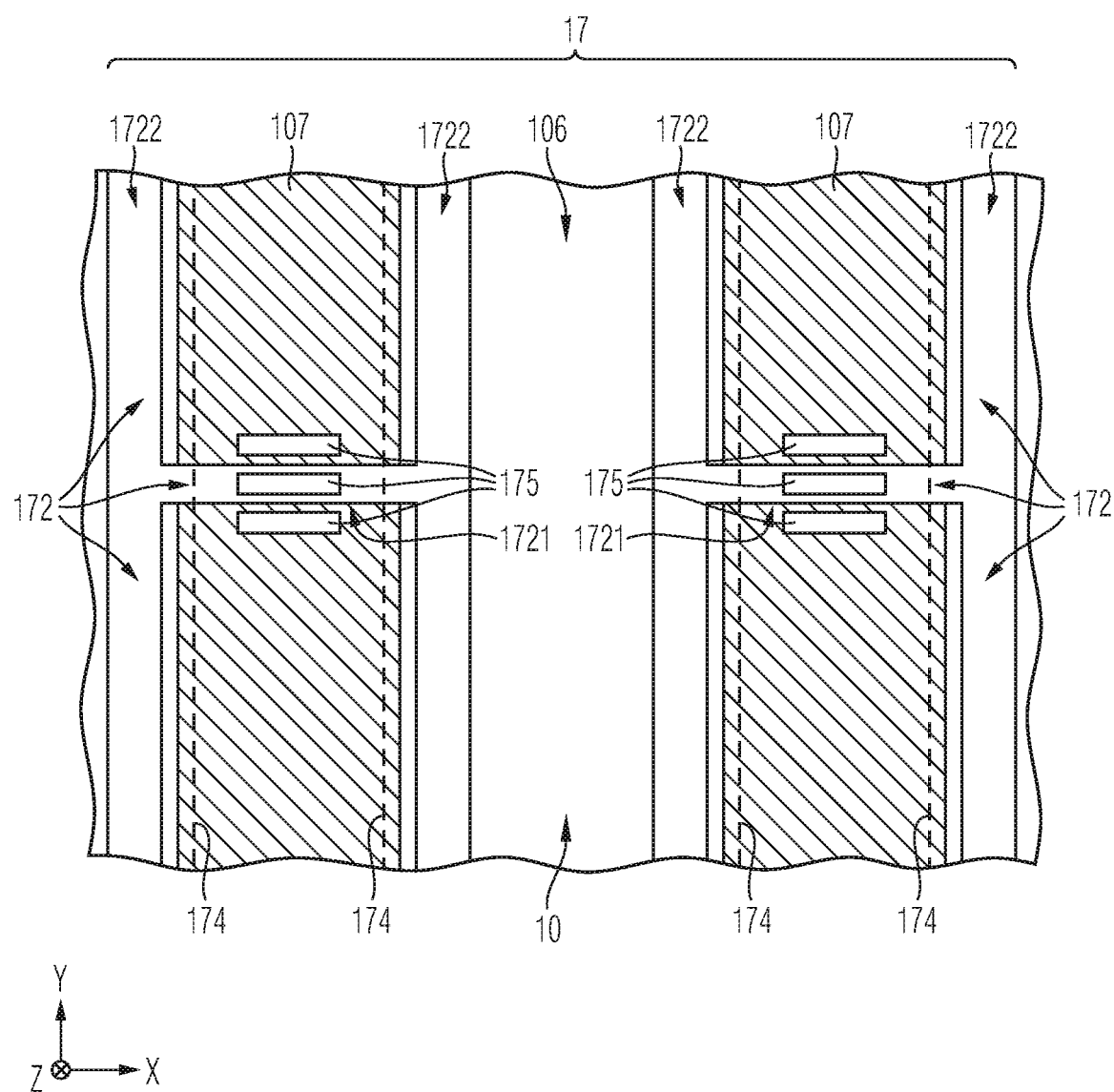
FIG. 3 schematically and exemplarily illustrates a section of a horizontal cross-section of a power semiconductor device in accordance with one or more embodiments.

FIG. 3 shows another exemplary embodiment, wherein the section of the edge termination region 107 depicted in FIG. 3 comprises two guard regions 107, each of which have an associated trench field plate structure 172. The trench field plate structures 172 comprise in each case a first portion 1721 extending orthogonally to the main lateral extension direction Y of the guard regions, and two second portions 1722 which are arranged on each side of the respective guard region 107 and which extend in parallel to the man lateral extension direction Y of the guard regions 107. As in the embodiment of FIG. 2, the trench field structure 172 of the embodiment shown in FIG. 3 comprises a conductive material having a first portion and a second portion (cf. reference numerals 173, 1731, 1732 in FIG. 2), which is, however, not depicted explicitly in FIG. 3.

Further, in accordance with the embodiment of FIG. 3, an intermediate region 106 of the first conductivity type may be included in the semiconductor body 10 at least partially between the two guard regions, wherein the second portion 1722 of the field plate trench structure 172 extends, at least partially, in the intermediate region 106. Further, in an embodiment, the second portion of the conductive material, which is arranged inside the second portion 1722 of the field plate trench structure, is not electrically connected with the intermediate region 106.

A metal 174 is in each case arranged above the respective first portion 1721 of the field plate trench structures 172. For example, an insulating layer may be arranged between each of the metal layers 174 and the associated guard region 107. Further, an electrical connection between the metal layer 174 and each of the guard region 107 and the first portion 1731 of the conductive material 173 (not depicted in FIG. 3, refer to FIGS. 5A-B) is established via respective contact grooves 175 provided in an insulating layer 108. The contact grooves extend essentially along the first lateral direction X, i.e., orthogonally to the main lateral extension direction Y of the guard regions 107.

For example, the contact grooves 175 may be filled with a conductive material and/or the metal layers 174 may extend through the contact grooves 175 so as to establish an electrical contact with each of the respective guard region 107 and the respective first portion 1731 of the conductive material 173. In FIG. 3, the conductive material 173 and its first and second portions 1731, 1732 as well as the field plate insulation structure 1725 are not depicted separately, since the focus is on the spatial arrangement of the guard regions 107, the trench field plate structures 172, and the contact grooves 175.

Figure 4:
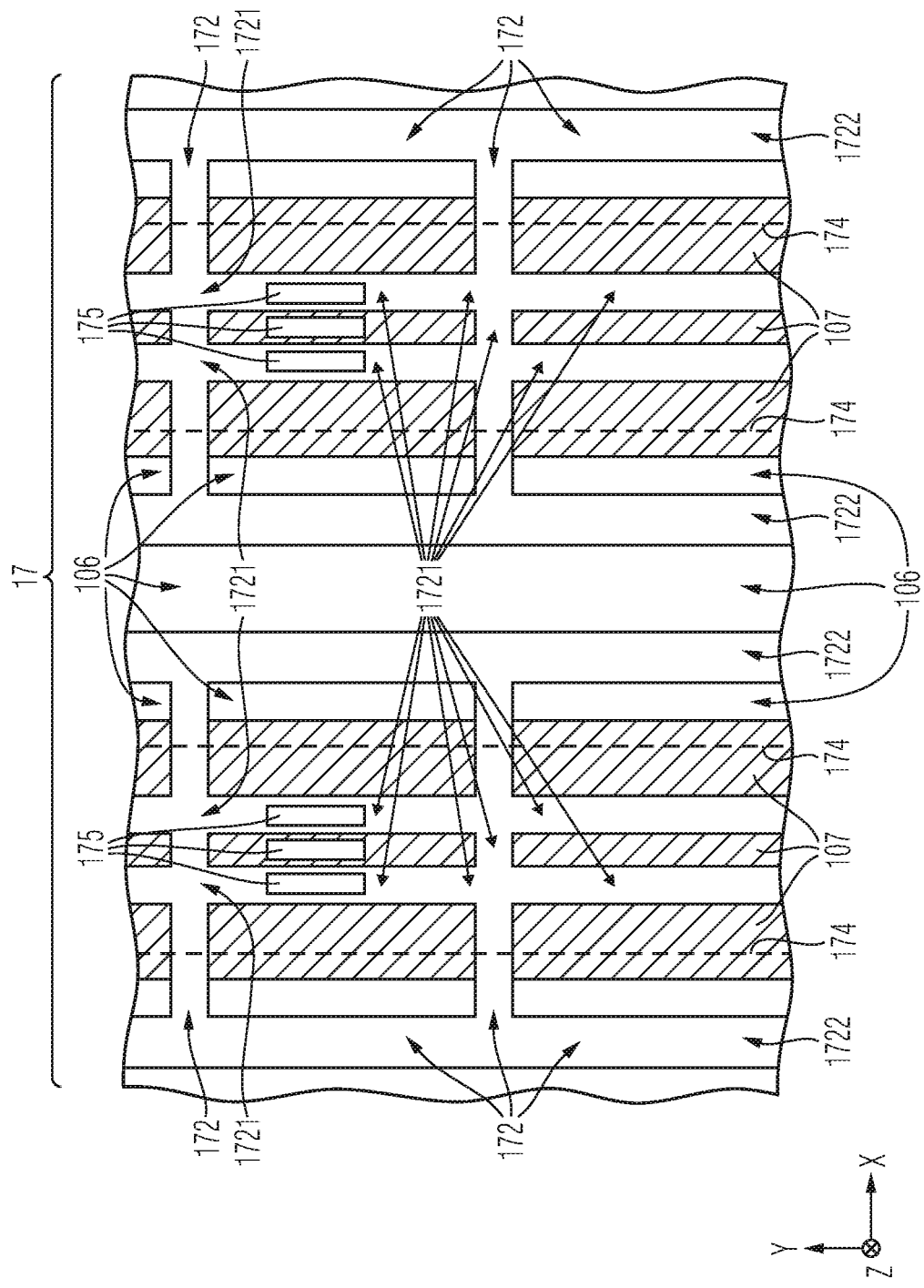
FIG. 4 schematically and exemplarily illustrates a section of a horizontal cross-section of a power semiconductor device in accordance with one or more embodiments.

FIG. 4 shows another variant embodiment which is similar to the embodiment of FIG. 3. However, as opposed to the embodiment of FIG. 3, in the present embodiment, each field plate trench structure 172 has a first portion 1721 that comprises two trench portions, which extend in parallel along the main lateral extension direction Y of the guard region 107. As previously stated with regard to FIG. 3, also in FIG. 4 and FIGS. 6-8, the conductive material 173 and its first and second portions 1731, 1732 as well as the field plate insulation structure 1725 are not depicted separately (insofar it is referred to FIG. 2). Contact grooves 175 extending along the main lateral extension direction Y are provided for establishing an electrical contact between the first portion 1731 of the conductive material 173 and the metal layer 174 as well as between the guard region 107 and the metal layer 174. At least one of the contact grooves 175, which contacts the guard region 107 and the metal layer 174, is provided between the two trenches of the first portion 1721 of the field plate trench structure 172. Further contact grooves 175 contact the first portion 1731 of the conductive material 173 and the metal layer 174. In another embodiment (not illustrated), a single contact groove 175 may be provided for establishing an electrical contact between the first portion 1731 of the conductive material 173 and the metal layer 174 as well as between the guard region 107 and the metal layer 174 (not illustrated in FIG. 4, see FIGS. 6 and 7).

FIG. 5A shows a section of a vertical cross section of a power semiconductor device 1 in accordance with one or more embodiments. For example, FIG. 5A further elucidates how the electrical contact between the first portion 1731 and the guard region 107 is established by means of the metal layer 174. The basic arrangement of the guard region 107 and field plate trench structure 172 corresponds to the embodiment of FIG. 4. Thus, in accordance with the embodiment of FIG. 4, contact grooves 175 are provided in the insulating layer 108, wherein the contact groove 175 for contacting the guard region 107 is provided between the two trenches of the first portion of the field plate trench structure 172.

As can be further seen in FIG. 5A, the first portion 1721 of the field plate trench structure 172 is entirely (i.e., including a trench bottom) embedded in the guard region 107, at least where it is arranged below the metal 174. In other words, the guard region 107 isolates the first portion 1721 of the field plate trench structure 172, at least where it is arranged below the metal layer 174, from the surrounding regions of the semiconductor body 10.

The guard region 107 may in turn be embedded in a semiconductor region of the first conductivity type 102. The intermediate region 106 may form a part of said semiconductor region of the first conductivity type 102. In the exemplary embodiment shown in FIG. 5A, the guard region 107 is separated from the trench portions that form the second portion 1722 of the field plate trench structure 172 by the semiconductor region 102. By contrast, in the embodiment shown in FIG. 5B, the guard region 107 is in contact with a sidewall of a trench that is part of the second portion 1722 of the field plate trench structure 172 (see left trench in FIG. 5B). Further, there is a shallow region 107-1 of the second conductivity type provided in the vicinity of the surface of the semiconductor body 10, which extends between the guard region 107 and the right and left trenches of the second portion 1722 of the field plate trench structure 172. For example, such a shallow region 107-1 of the second conductivity type may be produced as a by-product of some processing steps, e.g., upon formation of one or more body regions in the active region 16 of the power semiconductor device 1.

Figure 8:
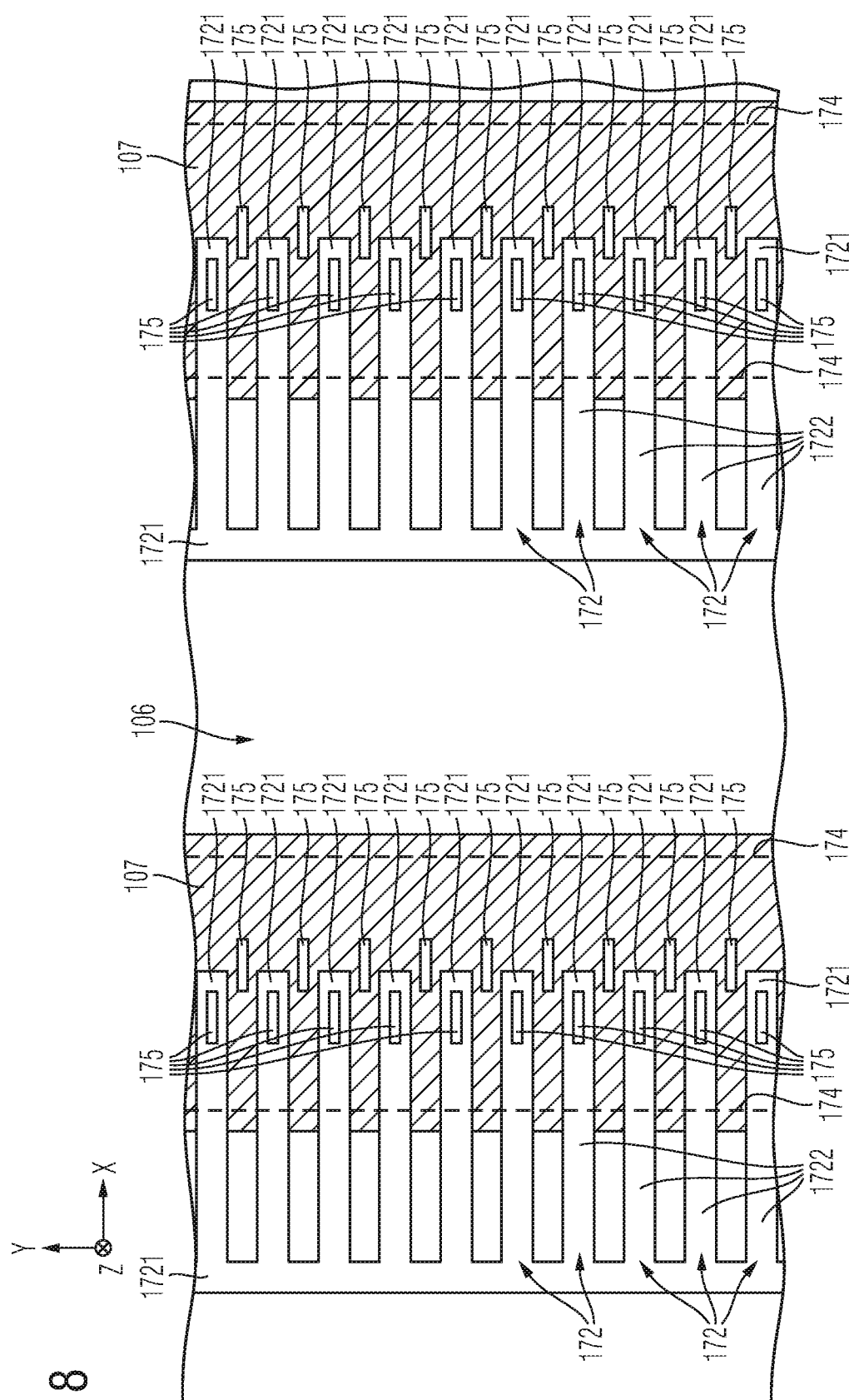
FIG. 8 schematically and exemplarily illustrates a section of a horizontal cross-section of a power semiconductor device in accordance with one or more embodiments.

The FIGS. 6-8 show further exemplary embodiments of a spatial arrangement of one or more guard regions 107 and a field plate trench structure 172 in an edge termination region 17 of a power semiconductor device 1. In these embodiments, the field plate trench structure 172 is, at least partially, formed as a grid comprising a plurality of trenches or trench portions that extend transversely to the main lateral extension direction Y of the guard region(s) 107 and a plurality of trenches or trench portions that extend in parallel to the main lateral extension direction Y.

For example, in each of FIGS. 6 and 7, the second portion 1722 of the field plate trench structure 172 is in each case arranged further away from a lateral chip edge 109 of the semiconductor body 10 than the guard region 107. In other words, the second portion 1722 of the field plate trench structure 172 is located between guard region 107 and the active region 16. In other embodiments (not depicted), inverse relations may apply, such that the second portion 1722 of the field plate trench structure 172 is arranged closer to a lateral chip edge 109 of the semiconductor body 10 than the guard region 107, or, put differently, the guard region 107 is located between second portion 1722 and the active region 16.

The embodiment of FIG. 7 differs from the one of FIG. 6 in that the second portion 1722 of the field plate trench structure 172 comprises a higher number of trenches. For example, functional properties of an edge termination structure may be adjusted by providing an appropriate number of trenches.

In the embodiments shown in FIGS. 6 and 7, one larger contact groove/hole 175 may be used to directly establish an electrical contact between the first portion 1721 of the field plate trench structure 172 and the guard region 107 instead of providing separate contacts 175 as shown in the embodiments of FIG. 3-5B. The contact groove/hole 175 may be part of the metal layer 174. In another embodiment (not illustrated), the metal layer 174 does not extend above the large contact groove/hole 175.

FIG. 8 illustrated another variant, e.g., with regard to the arrangement of the contact grooves 175. For example, the electrical contact between the conductive material 173 and the guard region 107 via the metal layer 174 may be established by means of a staggered arrangement of a plurality of contact grooves 175, as exemplarily shown in FIG. 8.

A method of processing a power semiconductor device 1, comprises: providing a semiconductor body 10; forming an active region 16 and an edge termination region 17, wherein, inside the active region 16, the semiconductor body 10 comprises a drift region of a first conductivity type, and wherein forming the edge termination region 17 comprises:

forming a guard region 107 of a second conductivity type, the guard region 107 being included in the semiconductor body 10 at a front side 10-1 of the semiconductor body 10 and surrounding the active region 16; forming a field plate trench structure 172 extending vertically into the semiconductor body 10 from the front side 10-1 and being at least partially filled with a conductive material 173, the conductive material 173 being electrically connected with the guard region 107 and insulated from the semiconductor body 10 external of the guard region 107 by a field plate insulation structure 1725, wherein a first portion 1721 of the field plate trench structure 172 extends, at least partially, into the guard region 107 and is arranged, at least partially, below a metal layer 174 that is arranged at the front side 10-1, the conductive material 173 of the field plate trench structure 172 being electrically connected with the guard region 107; and a second portion 1722 of the field plate trench structure 172 extends outside of the guard region 107 and surrounds the active area 16, wherein the metal layer 174 does not extend above the second portion 1722 of the field plate trench structure 172.

Embodiments of the method of forming a power semiconductor device described above correspond to the embodiments of the power semiconductor as described above, and vice versa. Hence, for example, the features of the embodiments of the power semiconductor device described above may be achieved by carrying out corresponding processing method step.

In the above, embodiments pertaining to power semiconductor switches and corresponding processing methods were explained. For example, these semiconductor devices are based on silicon (Si). Accordingly, a monocrystalline semiconductor region or layer, e.g., the semiconductor body 10 and its regions/zones, e.g., region 107 etc., can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device comprising a semiconductor body having an active region and an edge termination region, wherein, inside the active region, the semiconductor body comprises a drift region of a first conductivity type, and wherein the edge termination region comprises:
   a guard region of a second conductivity type that is included in the semiconductor body at a front side of the semiconductor body and surrounding the active region; and
   a field plate trench structure extending vertically into the semiconductor body from the front side and at least partially filled with a conductive material, the conductive material is electrically connected with the guard region and insulated from the semiconductor body external of the guard region by a field plate insulation structure,
   wherein a first portion of the field plate trench structure at least partially extends into the guard region and is at least partially arranged below a metal layer that is arranged at the front side,
   wherein a second portion of the field plate trench structure extends outside of the guard region and surrounds the active area,
   wherein the metal layer does not extend above the second portion of the field plate trench structure.

2. The power semiconductor device of claim 1, wherein the first portion of the field plate trench structure comprises a first portion of the conductive material that is electrically connected with the guard region, and wherein the second portion of the field plate trench structure comprises a second portion of the conductive material that is electrically connected with the guard region by means of the first portion of the conductive material.

3. The power semiconductor device of claim 2, wherein the conductive material is electrically connected with the guard region by means of the metal layer.

4. The power semiconductor device of claim 2, wherein an electrical connection between the metal layer and each of the guard region and the first portion of the conductive material is established via respective contact holes or contact grooves provided in an insulating layer that is arranged between the metal layer and the guard region.

5. The power semiconductor device of claim 1, wherein the conductive material is or comprises polysilicon.

6. The power semiconductor device of claim 1, wherein the second portion of the field plate trench structure is arranged closer to a lateral chip edge of the semiconductor body than the guard region.

7. The power semiconductor device of claim 1, wherein the second portion of the field plate trench structure is arranged further away from a lateral chip edge of the semiconductor body than the guard region.

8. The power semiconductor device of claim 1, wherein the first portion of the field plate trench structure is entirely embedded in the guard region at least where the first portion is arranged below the metal layer.

9. The power semiconductor device of claim 1, wherein at least a portion of the guard region has an elongate shape extending in a generally rectilinear manner along a main lateral extension direction.

10. The power semiconductor device of claim 9, wherein the field plate trench structure comprises one or more trenches or trench portions that extend in parallel to the main lateral extension direction.

11. The power semiconductor device of claim 10, wherein the first portion of the field plate trench structure comprises one or more trenches or trench portions that extend in parallel to the main lateral extension direction.

12. The power semiconductor device of claim 10, wherein the second portion of the field plate trench structure comprises one or more trenches or trench portions that extend in parallel to the main lateral extension direction.

13. The power semiconductor device of claim 9, wherein the field plate trench structure comprises one or more trenches or trench portions that extend transversely to the main lateral extension direction.

14. The power semiconductor device of claim 13, wherein the first portion of the field plate trench structure comprises one or more trenches or trench portions that extend transversely to the main lateral extension direction.

15. The power semiconductor device of claim 13, wherein the second portion of the field plate trench structure comprises one or more trenches or trench portions that extend transversely to the main lateral extension direction.

16. The power semiconductor device of claim 9, wherein the field plate trench structure is at least partially formed as a grid comprising a plurality of trenches or trench portions that extend transversely to the main lateral extension direction and a plurality of trenches or trench portions that extend in parallel to the main lateral extension direction.

17. The power semiconductor device of claim 1, wherein the edge termination region comprises:
at least one further guard region of the second conductivity type that is included in the semiconductor body at the front side of the semiconductor body and surrounding the active region; and
an intermediate region of the first conductivity type that is included in the semiconductor body at least partially between the guard region and the at least one further guard region,
wherein the second portion of the field plate trench structure at least partially extends in the intermediate region.

18. The power semiconductor device of claim 17, wherein the second portion of the conductive material is not electrically connected with the intermediate region.

19. The power semiconductor device of claim 1, wherein the power semiconductor device is or comprises at least one of an IGBT, a MOSFET, and a diode.

20. A method of processing a power semiconductor device, the method comprising:
providing a semiconductor body;
forming an active region and an edge termination region, wherein inside the active region, the semiconductor body comprises a drift region of a first conductivity type,
wherein forming the edge termination region comprises:
forming a guard region of a second conductivity type that is included in the semiconductor body at a front side of the semiconductor body and surrounding the active region;
forming a field plate trench structure extending vertically into the semiconductor body from the front side and at least partially filled with a conductive material, the conductive material is electrically connected with the guard region and insulated from the semiconductor body external of the guard region by a field plate insulation structure,
wherein a first portion of the field plate trench structure at least partially extends into the guard region and is at least partially arranged below a metal layer that is arranged at the front side,
wherein a second portion of the field plate trench structure extends outside of the guard region and surrounds the active area,
wherein the metal layer does not extend above the second portion of the field plate trench structure.

* * * * *